United States Patent [19]
Butlin et al.

[11] Patent Number: 4,937,638
[45] Date of Patent: Jun. 26, 1990

[54] EDGE EMITTING LIGHT EMISSIVE DIODE

[75] Inventors: Richard S. Butlin, Brixham; Andrew J. N. Houghton, Totnes, both of Great Britain

[73] Assignee: STC plc, London, England

[21] Appl. No.: 239,403

[22] Filed: Sep. 1, 1988

[30] Foreign Application Priority Data

Sep. 12, 1987 [GB] United Kingdom ................ 8721491

[51] Int. Cl.$^5$ ............................................. H01L 33/00
[52] U.S. Cl. ..................................................... 357/17
[58] Field of Search ........................ 357/17; 350/96.12

[56] References Cited
FOREIGN PATENT DOCUMENTS 1600965 10/1981 United Kingdom .
2090056  6/1982 United Kingdom .

OTHER PUBLICATIONS

"Computer Model of a Superluminescent LED with Lateral Confinement", D. Marcuse et al., IEEE Journal of Quantum Electronics, vol. QE-17, No. 7, Jul. 1981, pp. 1234 to 1244.

"Lateral Confinement in GaAsP Superluminescent Diode at 1.3 μm", I. P. Kaminow et al., IEEE Journal of Quantum Electronics, vol. QE-19, No. 1, Jan. 1983, pp. 78 to 81.

Primary Examiner—William L. Sikes
Assistant Examiner—Robert E. Wise
Attorney, Agent, or Firm—Lee, Mann, Smith, McWilliams & Sweeney

[57] ABSTRACT

An edge emitting light emissive diode for coupling light into single mode fibre has at its front end a structure (7) similar to that of a ridge laser, this structure being terminated at its rear end with a planar region (8) which is unpumped.

10 Claims, 5 Drawing Sheets

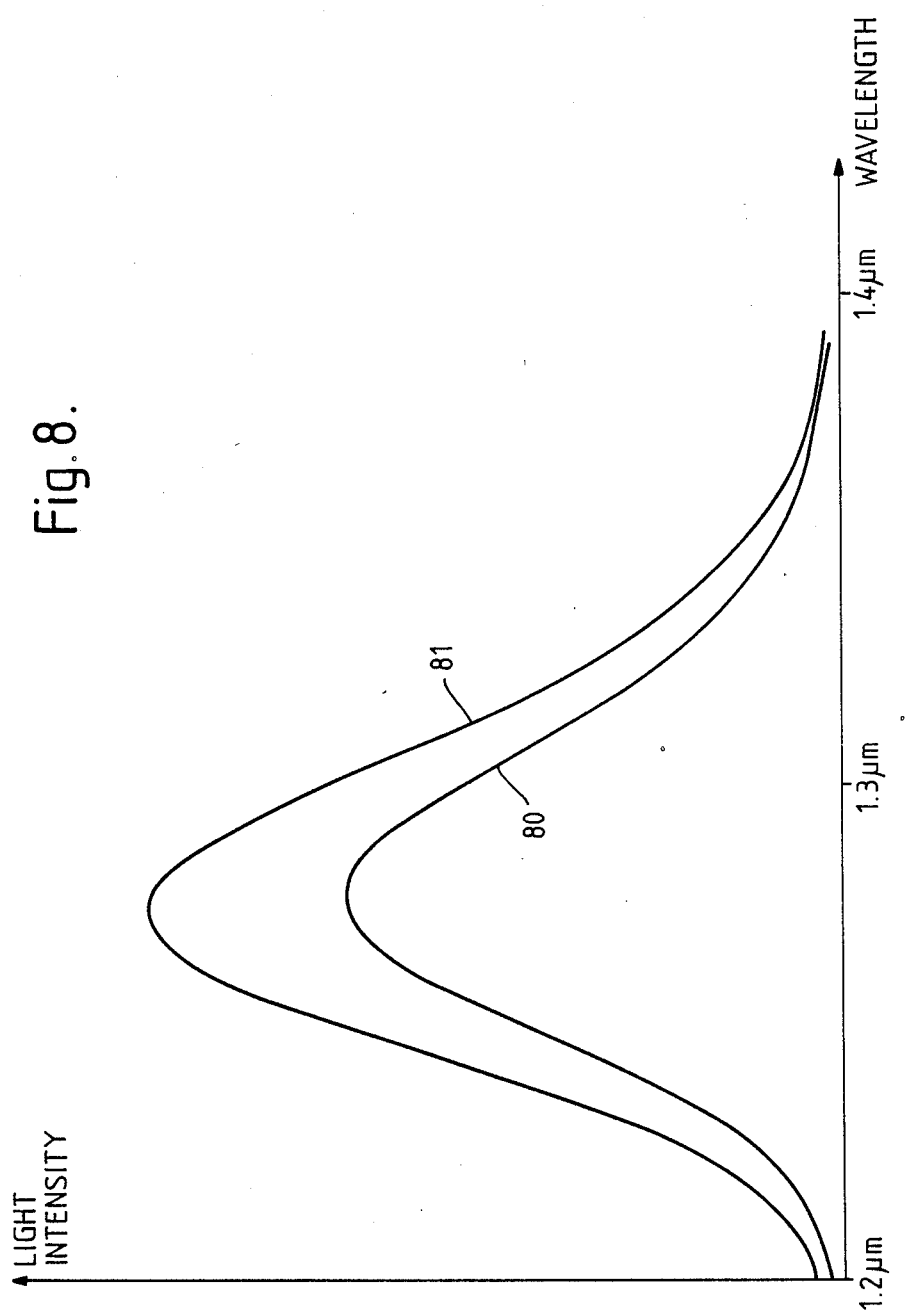

EDGE EMITTING LIGHT EMISSIVE DIODE

BACKGROUND OF THE INVENTION

This invention relates to light emissive diodes (LED's), and in particular to those of the edge-emissive variety (ELED's). Lasers and superluminescent diodes typically have greater brightnesses than non-superluminescent diodes but for number of applications the benefits of this increased brightness are outweighed by the disadvantage of the much greater temperature sensitivity of lasers and superluminescent diodes. Characteristically a non-superluminescent device exhibits saturation effects in which the rate of increase of light output with increasing drive current begins to fall off at high current drive, whereas in the case of a superluminescent device the characteristic is one of ever-increasing rate of increase of light output with increasing current drive up at least until the lasing threshold is reached.

This invention is specifically directed to ELED's which over a normal operating current range of 0 to 100 mA are substantially non-superluminescent at least down to a temperature of 10° and preferably over the temperature range from 0° to 70° C. Devices which show no signs of superluminescence over this temperature range may begin to show signs of superluminescence at much lower temperatures as a result primarily of the reduction in non-radiative recombination liable to occur at temperatures significantly beneath 0° C., but for many applications such temperatures lie far enough beneath typical service temperatures, and hence such devices will exhibit substantially no superluminescence in the course of normal use. Furthermore, even at much lower temperatures for example below −30° C. the lasing threshold current still lies outside the normal operating current range of 0 to 100 mA.

For many applications a stripe contact double heterosctucture ELED provides an acceptable source for launching short coherence length (non-laser) light into conventional multimode fibre. In order to raise the lasing threshold of the device, and hence be able to launch more short coherence length light into the fibre, the stripe contact may be arranged to terminate short of the rear end of diode. By terminating the stripe contact well short of one end of the semiconductor chip there is left an unpumped region of the chip beyond the end of the stripe. This unpumped region will remain optically obsorbing and hence minimise optical feedback that would otherwise tend to promote laser action. Examples of such ELED's with full length stripe contacts and with truncated stripe contacts are described for instance in United Kingdom Patent Specification No. 1,600,965.

In a conventional stripe contact ELED the semiconductor lasers are planar, and their composition is chosen to provide a refractive index profile that affords a real waveguiding effect in the direction normal to those layers. However, planar layers produce no lateral waveguiding effect, that is no waveguiding effect in the plane of the layers. The injected carriers under the stripe have the effect of reducing the effective refractive of the material and hence when the device is driven the resulting index profile in the transverse direction (lying in the plane of the layers at right angles to the stripe axis) tends to be anti-waveguiding.

A paper by D. Marcuse and I. P. Kaminow entitled "Computer Model of a Superluminescent LED with Lateral Confinement", IEEE Journal of Quantum Electronics, Volume QE-17, No. 7, July 1981, pages 1234 to 1244, provides a theoretical analysis of the performance of a superluminescent ELED which retains the unpumped region but replaces the truncated stripe contact structure with a more complicated structure that does provide lateral waveguiding. This ELED, which is also described in United Kingdom Patent Specification No. 2090056A, is expressly designed for matching with multimode fibre. The authors of this paper conclude from their analysis that such a structure has at least one major drawback, namely that 'it allows a strong reflected wave to build up, causing far more power to be dumped uselessly into the lossy internal diode structure (causing excess heating) than is available at the output end'. The authors then assert that 'the reflected wave is particularly harmful because, due to its high energy, it causes gain saturation, thus reducing the growth of the forward traveling wave that delivers power to the fiber'. In conformity with the teaching of this theoretical paper the second author, in conjunction with others, describes in a paper entitled "Lateral Confinement InGaAsP Superluminescent Diode at 1.3 $\mu$m", IEEE Journal of Quantum Electronics, Volume QE 19, No. 1, January 1983, pages 78 to 81, (I. P. Kaminow et al) the manufacture of an ELED for coupling to multimode fibre which, instead of having an absorbing region at the rear of the device, has its rear facet provided with a high reflectivity mirror.

SUMMARY OF THE INVENTION

By way of contrast, the present invention is directed to non-superluminescent ELED's suitable for coupling to single mode fibre, and arose out of attempts to launch more optical power into single mode optical fibre than can be conveniently and easily be launched from a truncated stripe contact non-superluminescent ELED, but which retains the desirable relative stability of output power with temperature variation which is observed in stripe contact non-superluminescent ELED's.

According to the present invention there is provided an electroded edge emissive light emissive diode chip which is structured to confine current injection across the p-n junction of the diode substantially exclusively to an active region that extends along an axis from substantially one end facet of the chip, the output facet, to a point intermediate said output facet and the opposite end facet, which chip has a refractive index structure providing, for the active region, real optical waveguiding in all directions at right angles to said axis, and, for the region of the chip extending along the axis beyond the active region between said intermediate point and said opposite facet, no real optical waveguiding for at least one direction at right angles to said axis, wherein the active region is short enough substantially to prevent superluminescence at least down to a temperature of 10° C. over an operating current range of 0 to 100 mA, and wherein in the active region the refractive index profile is such as to provide substantially single mode waveguiding for matching with that of a single mode fibre.

Many different ways of providing a real lateral waveguiding effect in semiconductor lasers, and many if not all of these ways are likely to be possible also for use in the construction of non-superluminescent ELED's A preferred way of providing this lateral waveguiding effect in ELED's constructed in accordance with the teachings of the present invention is by adopting a ridge structure in which the effective refractive index of a planar active layer bounded on both faces by lower refractive index material is locally raised by the presence of an overlying ridge of material protruding into material of a lower refractive index.

In the case of stripe contact double heterostructure ELED's made of InGaAsP emitting at 1.3 μm it has been found possible, with a relatively low yield, to produce non-superluminescent devices capable of providing a launched power into conventional 10 um spot size single mode fibre of 4 to 5 μW, whereas with ridge-structure ELED's constructed from the same materials in accordance with the teachings of the present invention it has been found possible to get relatively good yields of devices providing a launched power of at least 15 μW and at least one device has been found to provide a launched power of 60 μW. With these particular materials the length of the active region defined by the ridge advantageously typically lies in the range from 100 to 200 μm. With longer ridges there is an increased risk of the device no longer remaining non-superluminescent, whereas with shorter ridges there is a power penalty.

BRIEF DESCRIPTION OF THE DRAWINGS

There follows a description of the manufacture of non-superluminescent InGaAsP truncated ridge structure ELED's embodying the invention in a preferred form. The description refers to the accompanying drawings in which:

FIG. 8 is a plot of the spectral characteristic at two different levels of current drive.

DETAILED DESCRIPTION OF THE PREFERRED EMBODIMENT

Figure 1:
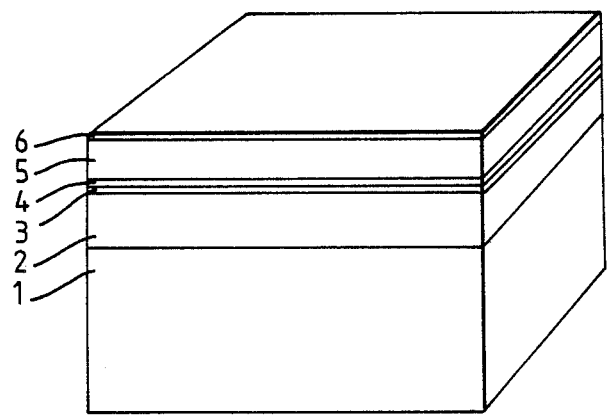
FIG. 1 is a schematic perspective view of the device prior to the etching of the channels which define the ridge structure.

A succession of layers 2, 3, 4, 5 and 6 is epitaxially grown upon an n+-type indium phosphide (InP) substrate 1. Typically liquid phase epitaxy is used for this process, through organo-metallic vapour phase epitaxy could for instance be used instead. The first epitaxial layer to be grown, layer 2, is an n-type InP buffer layer. This layer is typically between 2 and 5 μmin thickness. Its growth is succeeded by the growth of layer 3 which is the active layer of the device. The active layer is thinner, typically being in the range from 0.08 μm to 0.50 μm in thickness. The active layer is made of p-type or n-type InGaAsP, and its composition is chosen having regard to the wavelength of emission required from the device. Typically this will be either in the wavelength range from 1.20 μm to 1.35 μm or the range from 1.46 μm to 1.58 μm. In a specific preferred example of diode for operation at 1.3 μm the composition of the active layer 3 is $In_{.71}Ga_{.29}As_{.62}P_{.38}$ and its thickness is 0.15 um. Layer 4 is a p-type anti-meltback/guide layer, also of quaternary InGaAsP, but of a composition corresponding to a shorter emission wavelength than that of the active layer, typically a composition corresponding to an emission wavelength of 1.18 μm or 1.06 μm. The thickness of this layer 4 lies typically in the range 0.1 to 0.3 μm. A thickness of 0.25 μm is preferred for use with the 0.15 μm thickness active layer. The remaining epitaxial layers of the structure, layers 5 and 6, are respectively a p-type cladding layer of InP which is typically about 1.5 μm thick, and a p-type contact layer of InGaAsP which is typically about 0.2 μm thick and may conveniently have the same composition as that of layer 4.

Figure 2:
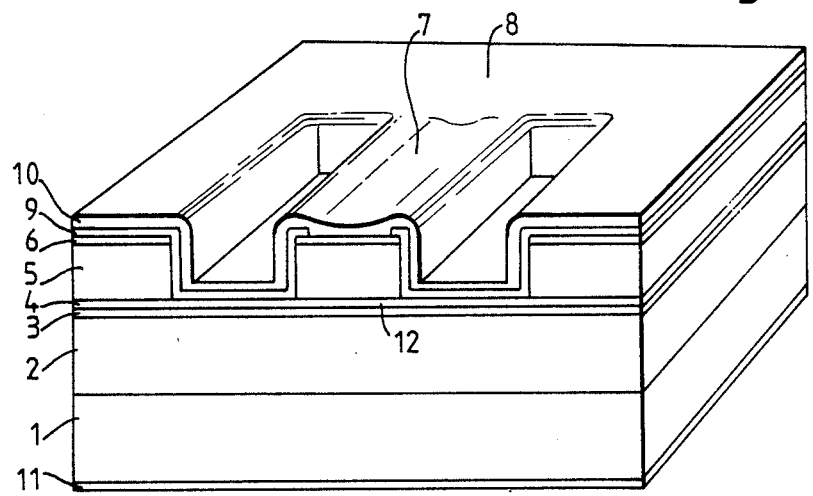
FIG. 2 is a schematic perspective view of the completed device.

Referring now to FIG. 2, wet chemical etching is employed to etch two channels through the contact and cladding layers 6 and 5 so as to define an intervening ridge 7 that is typically between 3 and 5 μm in width. The length of the channels is shorter than the equivalent dimension of the substrate so that the ridge 7 extends outwardly from a planar region 8. These channels are etched through an oxide mask (not shown) after photolithography. A KKI-type etch is used to remove the quaternary material of layer 6. An $H_3PO_4$ : HCl etch is used for removal of the InP of layer 5 since, with this etch, etching is substantially halted upon exposure of the underlying quaternary material of the anti-meltback/guide layer.

A layer 9 of silica to a depth of about 0.3 μm is deposited over the surface to provide electrical insulation, and then a window registering with the ridge is opened in this silica. Next the substrate 1 is thinned from about 300 μm to about 100 μm before the deposition of an evaporated TiPtAu p-type contact metallisation layer 10 on the top surface and an evaporated AuSnAu n-type contact metallisation layer 11 on the bottom surface. These metallisation layers are then alloyed in to the semiconductor material. In the case of layer 10 this alloying in occurs only on the ridge 7 because elsewhere the silica insulation 9 acts as a mask.

The composition of the layers, the layer thicknesses and the ridge width are the same as those of a class of ridge structure lasers (in which the extends the full length of the clip) whose ribs provide such lasers with a lateral waveguiding effect for the region of the active layer underlying the ridge calculated to correspond to a numerical aperture of approximately 0.2, and which operate as single transverse mode lasers. The ELED is thus clearly seen to be substantially mode matched with single mode fibre.

FIGS. 1 and 2 depict a single ELED device but, in accordance with normal practice in LED and injection laser fabrication technology, the epitaxial growth, the masking, etching metallising and alloying are performed upon a wafer, which only then is cleaved up into bars and then into individual device chips. If desired an anti-reflection coating (not shown) may be applied to the output facet 12 of the device, though this is not necessary in many instances. If such a coating is to be provided it will normally be applied to individual bars before they are subdivided into individual device chips.

The length of the ridge 7 is typically in the range from 100 to 200 μm with a preferred value within this range being about 165 μm. The distance across the planar region 8 from the rear of the ridge 7 to the near facet opposite the output facet 12 is typically in the range 80 to 250 μm, and the preferred value for this distance is 100 μm. The width of the device chip is not critical, and typically is about 300 μm.

Figure 3:
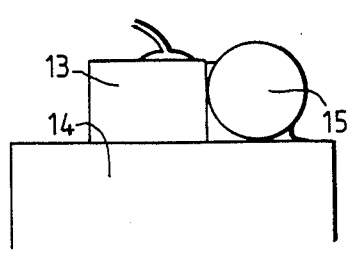
FIG. 3 depicts the device mounted upon a heat sink.

In FIG. 3 such a device chip is depicted at 13 mounted on top of a heat sink 14, which may for instance be a diamond pedestal or a gold-plated copper header. The chip may be mounted p-side up or p-side down as required, and can be secured to the heat sink with a gold/tin and lead/tin solder or with an electrically conducting epoxy. A preferred way of collecting the emitted light from the chip and directing it into the end of a single mode optical fibre (not shown) is to mount a spherical lens 15 of high index material such as zircon on the heat sink adjacent to the chip. If the chip is mounted p-side down the lens will need to be mounted on the side of the heat sink. The assembly is located inside a package (not shown) dimensioned so that the lens brings the emitted light to an approximate focus (disc of least confusion) at the outer surface of a window (not shown) provided in the package wall.

Figure 4:
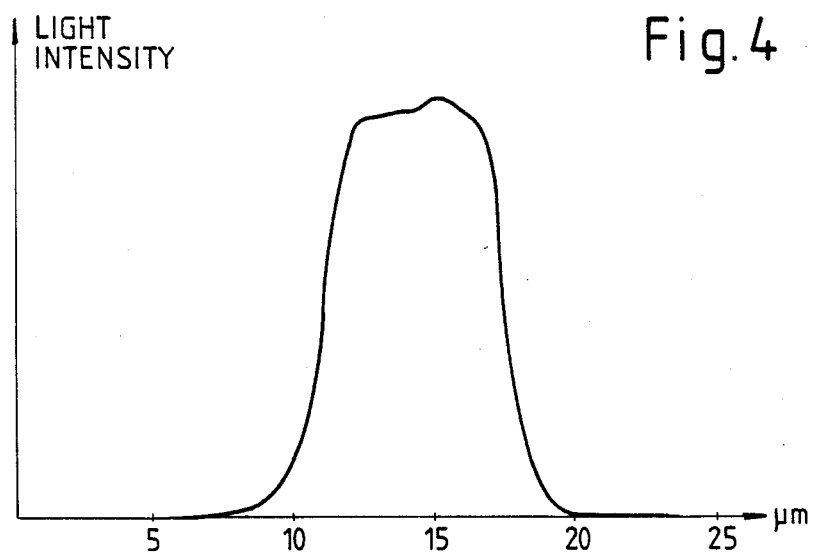
FIGS. 4 and 5 are plots of near field intensity profiles.
Figure 5:
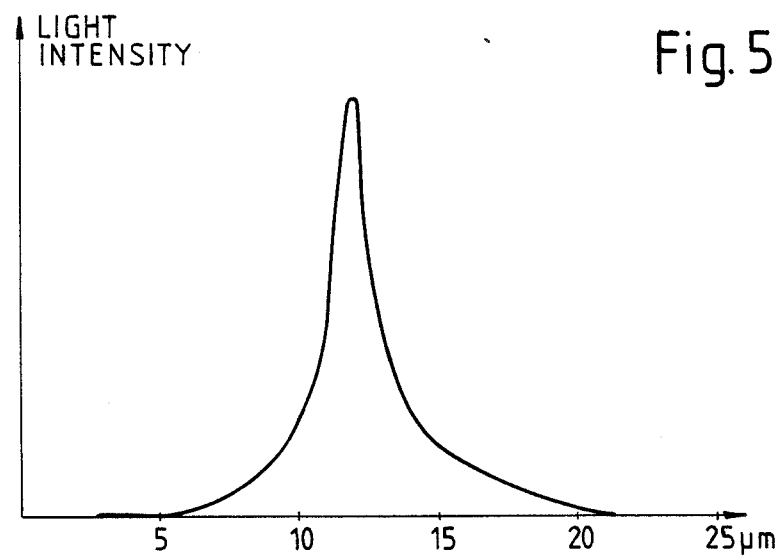
Figure 6:
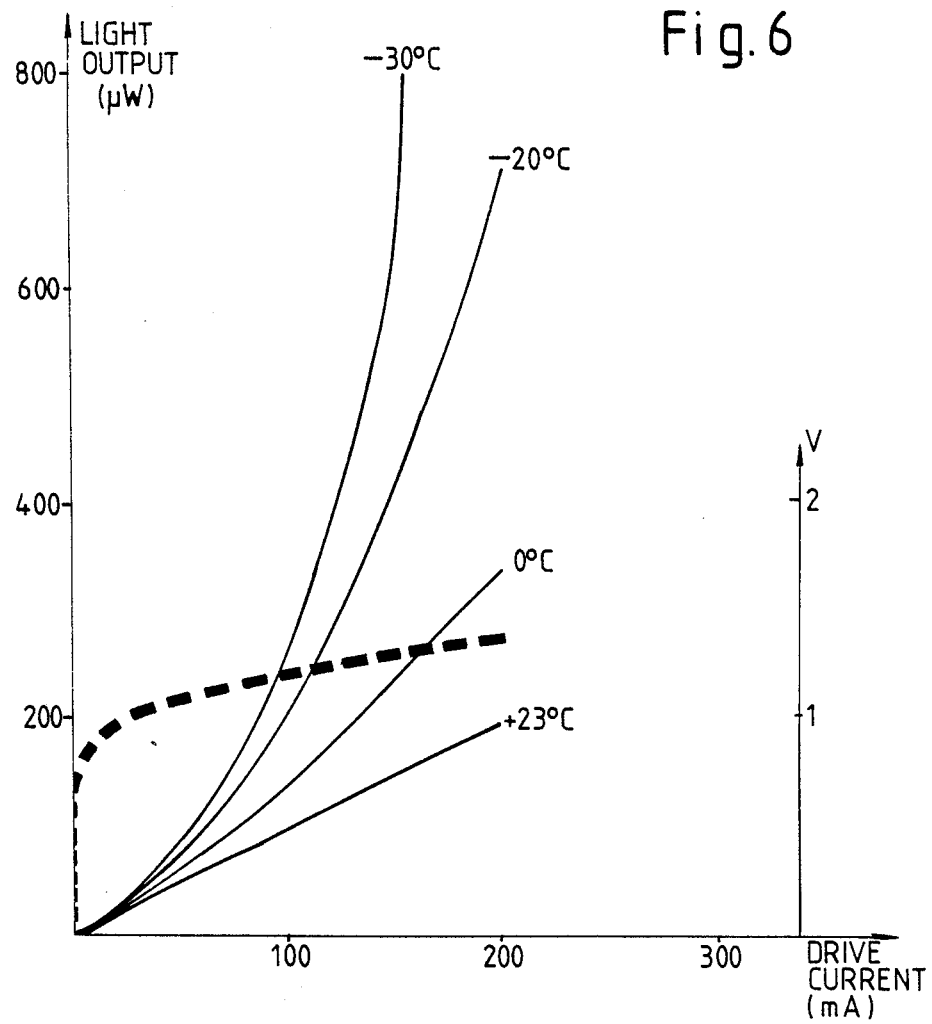
FIGS. 6 and 7 are plots showing the relationship between drive current and light output at different temperatures of operation.
Figure 7:
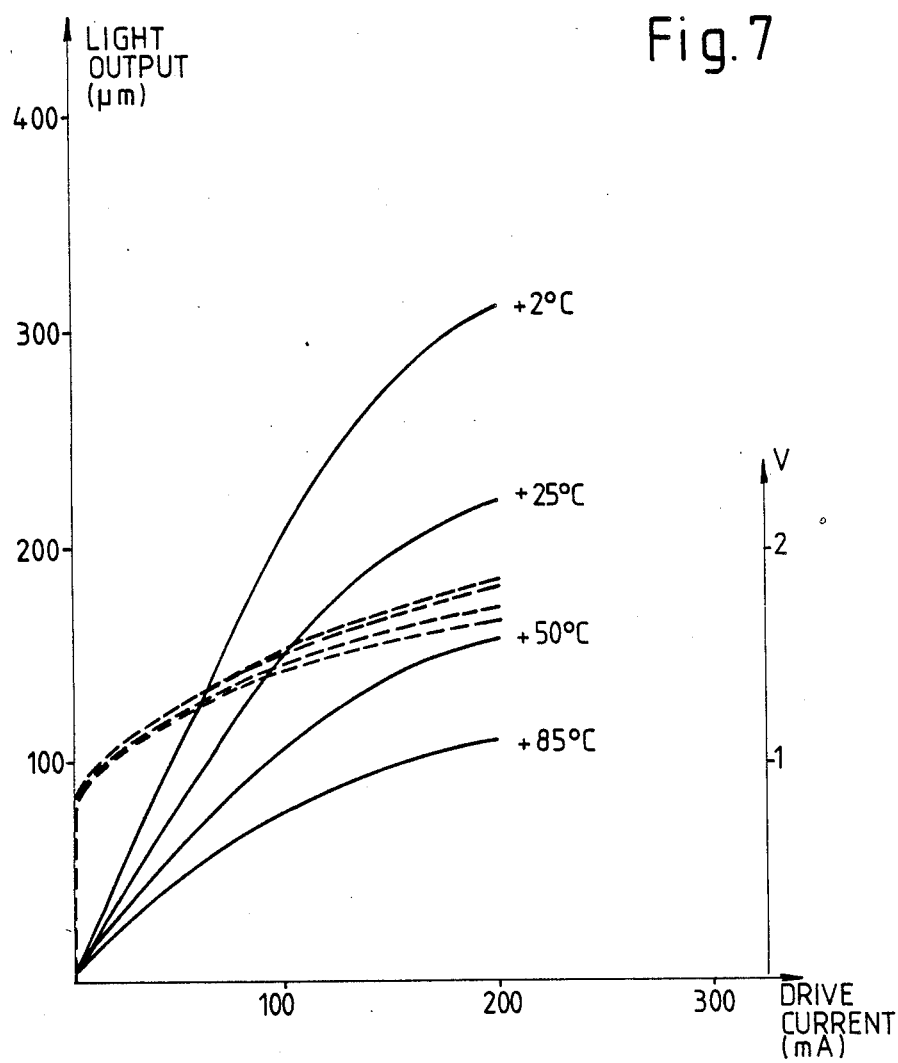

FIGS. 4 and 5 depict the intensity profile of the near field pattern of a representative chip (without lens 15) measured across the middle of the pattern respectively in the long direction (in the plane of the epitaxial layers) and the short direction (normal to the layers). This is for a room temperature device driven at 50 mA. FIGS. 6 and 7 depict how in two representative examples of chip the light output varies as a function of drive current at different temperatures. The light output is calibrated in terms of uW collected by a 0.5 N.A. detector. Also shown, by means of broken lines, are the corresponding current/voltage characteristics of the two devices.

FIG. 8 depicts at 80 and 81 spectral characteristics of a third device measured at 20° C. for two different current drive levels, namely 100 mA and 150 mA respectively. The two characteristics exhibit substantially the same full width half maximum (FWHM) of approximately 750 nm, whereas if superluminescence were occuring the higher drive current would have been associated with a significant narrowing of the spectral characteristic.

We claim:

1. An electroded edge emissive light emissive diode chip which is structured to confine current injection across the p-n junction of the diode substantially exclusively to an active region, said active region extending for a length along an axis from substantially one end facet of the chip, the output facet, to a point intermediate said output facet and the opposite end facet, which chip has a refractive index structure, said structure providing, for the axial length of the active region, real optical waveguiding in all directions at right angles to said axis, and, for the region of the chip extending along the axis beyond the active region between said intermediate point and said opposite facet, no real optical waveguiding for at least one direction at right angles to said axis, wherein the length of the active region is such that substantially no superluminescence is emitted by the chip at least down to a temperature of 10° C. over an operating current range of 0 to 100 mA, and wherein in the active region said refractive index structure has a profile providing substantially single mode waveguiding for matching with that of a single mode fibre.

2. A light emissive diode chip as claimed in claim 1 wherein the length of the active region is such that substantially no superluminescence is emitted at least over the temperature range 0° C. to 70° C. over an operating current range of 0 to 100 mA.

3. A light emissive diode chip as claimed in claim 1, wherein the axial length of the active region lies in the range from 100 to 200 $\mu m$, and where the axial length of the region of the chip extending along said axis beyond said active region between said intermediate point and said opposite facet lies in the range from 80 to 250 $\mu m$.

4. A light emissive diode chip as claimed in claim 1, which chip is made of InGaAsP.

5. A light emissive diode chip as claimed in claim 1, wherein a part of the real optical waveguiding in the active region is provided by a ridge structure.

6. A light sensitive diode chip as claimed in claim 5, which chip is made of InGaAsP.

7. A light emissive diode chip as claimed in claim 6, wherein the length of the active region is such that substantially no superluminescence is emitted at least over the temperature range 0° C. to 70° C. over an operating current range of 0 to 100 mA.

8. A light emissive diode chip as claimed in claim 7 wherein the axial length of the active region lies in the range from 100 to 200 $\mu m$, and wherein the axial length of the region of the chip extending along said axis beyond said active region between said intermediate point and said opposite facet lies in the range from 80 to 250 um.

9. An electroded edge emissive light emissive diode chip which is structured to confine current injection across the p-n junction of the diode substantially exclusively to an active region, said active region extending for a length along an axis from substantially one end facet of the chip, the output facet, to a point intermediate said output facet and the opposite end facet, which chip has a refractive index structure, said structure providing, for the axial length of the active region, real optical waveguiding in all directions at right angles to said axis, and, for the region of the chip extending along the axis beyond the active region between said intermediate point and said opposite facet, no real optical waveguiding for at least one direction at right angles to said axis, wherein the axial length of the active region lies in the range from 100 to 200 um, and wherein the axial length of the region of the chip extending along the axis beyond the active region between said intermediate point and said opposite facet lies in the range from 80 to 250 um, and wherein in the active region said refractive index structure has a profile providing substantially single mode waveguiding for matching with that of a single mode fibre.

10. An electroded InGaAsP edge emissive light emissive diode chip which is structured to confine current injection across the p-n junction of the diode substantially exclusively to an active region, said active region extending for a length along an axis from substantially one end facet of the chip, the output facet, to a point intermediate said output facet and the opposite end facet, which chip has a refractive index structure, said structure providing, for the axial length of the active region, real optical waveguiding in all directions at right angles to said axis, part of which real optical waveguiding is provided by a ridge structure, and, for the region of the chip extending along the axis beyond the active region between said intermediate point and said opposite facet, no real optical waveguiding for at least one direction at right angles to said axis, wherein the axial length of the active region lies in the range from 100 to 200 um, and wherein the axial length of the region of the chip extending along the axis beyond the active region between said intermediate point and said opposite facet lies in the range from 80 to 250 um, and wherein in the active region said refractive index structure has a profile providing substantially single mode waveguiding for matching with that of a single mode fibre.

* * * * *